United States Patent
Nakamura

(10) Patent No.: US 7,360,116 B2
(45) Date of Patent: Apr. 15, 2008

(54) BUILT-IN SELF TEST CIRCUIT

(75) Inventor: Yoshiyuki Nakamura, Kanagawa (JP)

(73) Assignee: NEC Electronics Corp. (JP)

( * ) Notice: Subject to any disclaimer, the term of this patent is extended or adjusted under 35 U.S.C. 154(b) by 503 days.

(21) Appl. No.: 10/402,956

(22) Filed: Apr. 1, 2003

(65) Prior Publication Data

US 2003/0191998 A1    Oct. 9, 2003

(30) Foreign Application Priority Data

Apr. 3, 2002    (JP) .............................. 2002-101244

(51) Int. Cl.
 *G06F 11/00*    (2006.01)
(52) U.S. Cl. ..................... 714/30; 714/33; 714/42; 714/7
(58) Field of Classification Search ................ 714/30, 714/33, 42
 See application file for complete search history.

(56) References Cited

U.S. PATENT DOCUMENTS

| | | | | |
|---|---|---|---|---|
| 3,423,558 | A * | 1/1969 | Brennen ..................... | 219/98 |
| 5,764,657 | A * | 6/1998 | Jones ......................... | 714/738 |
| 6,019,502 | A * | 2/2000 | Baeg et al. ................ | 714/718 |
| 6,182,257 | B1 * | 1/2001 | Gillingham ................ | 714/733 |
| 6,321,320 | B1 * | 11/2001 | Fleischman et al. ........ | 711/217 |
| 6,338,154 | B2 * | 1/2002 | Kim ........................... | 714/743 |
| 6,421,789 | B1 * | 7/2002 | Ooishi ........................ | 714/7 |
| 6,425,103 | B1 * | 7/2002 | Phan .......................... | 714/733 |
| 6,442,085 | B1 * | 8/2002 | Fragano et al. ............ | 365/201 |
| 6,523,135 | B1 | 2/2003 | Nakamura | |
| 6,617,869 | B1 | 9/2003 | Pillkahn | |
| 6,668,347 | B1 * | 12/2003 | Babella et al. ............. | 714/733 |
| 6,675,337 | B1 * | 1/2004 | Tung et al. ................. | 714/733 |
| 6,854,080 | B2 * | 2/2005 | Tanaka et al. ............. | 714/720 |
| 2002/0026606 | A1 * | 2/2002 | Stubbs ....................... | 714/710 |
| 2002/0124217 | A1 * | 9/2002 | Hiraide et al. ............. | 714/726 |
| 2002/0133768 | A1 * | 9/2002 | Gupta et al. ............... | 714/719 |
| 2002/0138802 | A1 * | 9/2002 | Firth et al. ................ | 714/733 |
| 2003/0097614 | A1 * | 5/2003 | Rajski et al. ............... | 714/30 |
| 2004/0030958 | A1 * | 2/2004 | Moerman .................... | 714/30 |

FOREIGN PATENT DOCUMENTS

| | | |
|---|---|---|
| DE | 199 38 060 A1 | 3/2001 |
| JP | 8-15382 | 1/1996 |
| JP | 2000-76894 | 3/2000 |

OTHER PUBLICATIONS

Dr. techn. Manfred Gerner, et al., "Selbsttest digitaler Schaltungen," R. Oldenbourg Verlag Munchen Wien 1990.
German Office Action issued Mar. 8, 2006 w/ English translation of relevant portions.

* cited by examiner

*Primary Examiner*—Nadeem Iqbal
*Assistant Examiner*—Loan Truong
(74) *Attorney, Agent, or Firm*—Dickstein, Shapiro, LLP.

(57) ABSTRACT

A built-in self test circuit (BIST circuit) in an LSI includes a verification test pattern generator for generating verification test pattern which is used for verifying the connections in the LSI including the BIST circuit in the design stage thereof, and another test pattern generator which is used to test the function of the LSI.

8 Claims, 10 Drawing Sheets

FIG. 6A
FIG. 6B
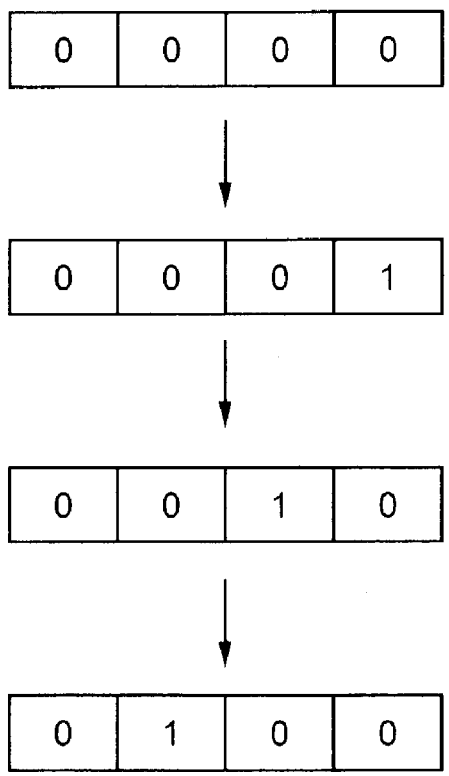
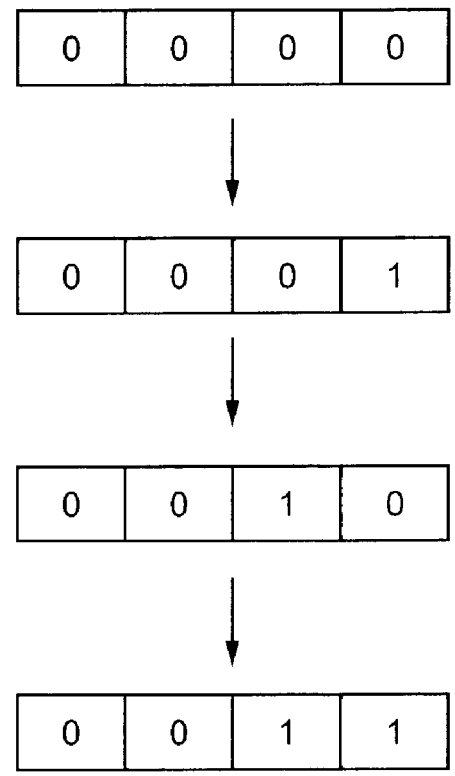

BUILT-IN SELF TEST CIRCUIT

BACKGROUND OF THE INVENTION (a) Field of the Invention

The present invention relates to a built-in self test (BIST) circuit, and more particularly, to a BIST circuit which is capable of generating a test pattern including series of test input signals and test result signals.

(b) Description of the Related Art

A BIST circuit is incorporated in an LSI for testing the function of the LSI. The LSI is evaluated by the BIST circuit as to non-defectiveness in the function thereof after the completion of the product. FIG. 10 shows a conventional BIST circuit incorporated in a system LSI (logic circuit), described in Patent Publication JP-A-8-15382.

A plurality of scan paths 62 are formed each grouping the flip-flops disposed in the internal circuit of the LSI 61, when a test mode is selected for the LSI. Each scan path 62 connects the group of flip-flops in a cascade (serial) connection, and is associated with a corresponding scan-in pin 65 which receives a series of input scan-in signals, i.e., scan-in signal pattern. The received scan-in signal pattern is shifted forward along the scan path 62 through the flip-flops, which operate with a clock signal, to be output from the scan path 62.

Each scan-in signal passed by the scan path 62 is delivered to a corresponding logic gate 66, and compared by using a logic operation in the logic gate 66 against the scan-in signal which is directly input to the logic gate 66. The comparison results are delivered to the data compression unit 64 from the logic gates 66. In the logic operation for the comparison, an external pin 67 is used for receiving a specified signal, which masks some signals liable to assuming unstable states of logic after passing the scan path. The data output from the data compression unit 64 is delivered to an external LSI tester through the scan-out pins (not shown). By examining the data from the data compression unit 64, presence or absence of a defect in the internal circuit of the LSI can be judged. The circuit test using the above scan paths costs a large amount of time due to the configuration wherein the serially connected flip-flops consecutively shift the scan-in signal responding to the clock signal.

The BIST circuit is also used for examining the non-defectiveness of memory cells in a semiconductor memory device such as a DRAM. In the evaluation of memory cells, a variety of test patterns including a marching pattern and a checkered pattern are generally used. The BIST circuit includes a test pattern generator block for generating test patterns including a series of data patterns and a variety of address patterns, the latter specifying the memory cells from the first address to the final address. The BIST circuit writes and reads data "1" or "0" specified by the data pattern into/from memory cells of the addresses specified by the address pattern, and compares the read data against the preceding write data to examine the non-defectiveness of the memory cells and corresponding interconnects. The BIST circuit incorporated in the DRAM generally includes a test pattern generator block having a larger circuit scale due to the large number of test patterns being needed for examining the function of the DRAM.

Patent Publication JP-A-2000-76894 describes a BIST circuit having a test pattern generator, which generates another test pattern while using a counter, after a test using a previous test pattern is finished. This BIST circuit can generate a large number of test patterns by using a single pattern generator while suppressing the increase of the circuit scale.

As understood from the above description, the BIST circuits are designed for testing the presence or absence of defects in the LSIs after the fabrication processes thereof, the LSIs including a logic circuit and/or memory device. It is to be noted that the BIST circuit should also be designed correctly for achieving the function thereof because the BIST circuit itself is also one of the electric circuits in the LSI. The functions of the LSI including the BIST circuit are verified or examined based on the operations and the test results by the BIST circuit generating the test pattern during the test operation.

It is effective to verify the correctness of the circuits in the LSI by examining the interconnects therein during the design stage thereof for achieving reduction of costs and turn around time of the LSI by preventing defects from occurring in the next stages. In such a case, the verification must be achieved in both the internal circuit and the BIST circuit of the LSI. It is noted, for the design verification of the interconnects in the circuit, the test patterns generated by the test pattern generator in the BIST circuit may be effectively used.

However, since the ordinary test patterns generated by the test pattern generator are dedicated to finding the physical defects in the LSI, the number of test patterns is large. Thus, if the ordinary test patterns are used for verifying the LSI in the design stage thereof, the verification necessitates a larger amount of test time. In addition, if the verification test patterns for use in the design verification are manually created separately from the ordinary test patterns to be generated by the BIST circuit, this costs huge man-hours to thereby raise the fabrication costs of the LSI.

In view of the above, it is an object of the present invention to provide a BIST circuit capable of facilitating the design verification of an LSI including the BIST circuit which generates test patterns for testing the internal circuit of the LSI.

It is another object of the present invention to provide a method for verifying the design of an LSI including a BIST circuit by using the test patterns to be generated by the BIST circuit itself.

The present invention provides a built-in self test (BIST) circuit for testing an internal circuit of an LSI, including a verification test pattern generator for generating a verification test pattern, wherein the verification test pattern is dedicated to verification of electric connections in the LSI.

The present invention also provides a method for testing the LSI by using the BIST circuit according to the present invention.

In accordance with the BIST circuit and the method of the present invention, since the test patterns to be generated by the verification test pattern generator in the BIST circuit are used for verification of design connections in the LSI during the design stage thereof, man-hours for creating the verification test patterns can be reduced. In addition, since the number of test patterns to be generated by the verification test pattern generator can be much smaller than the number of test patterns to be generated by the conventional test pattern generator due to the limited usage thereof, the time length needed to verify the design connections in the LSI can be reasonably short.

The above and other objects, features and advantages of the present invention will be more apparent from the following description, referring to the accompanying drawings.

BRIEF DESCRIPTION OF THE DRAWINGS

FIGS. 3A to 3C are schematic diagrams of data stored in the memory cells during a marching pattern test.

FIGS. 6A and 6B are schematic diagrams of address transition in the verification test pattern generator and marching pattern generator, respectively.

PREFERRED EMBODIMENTS OF THE INVENTION

Figure 1:
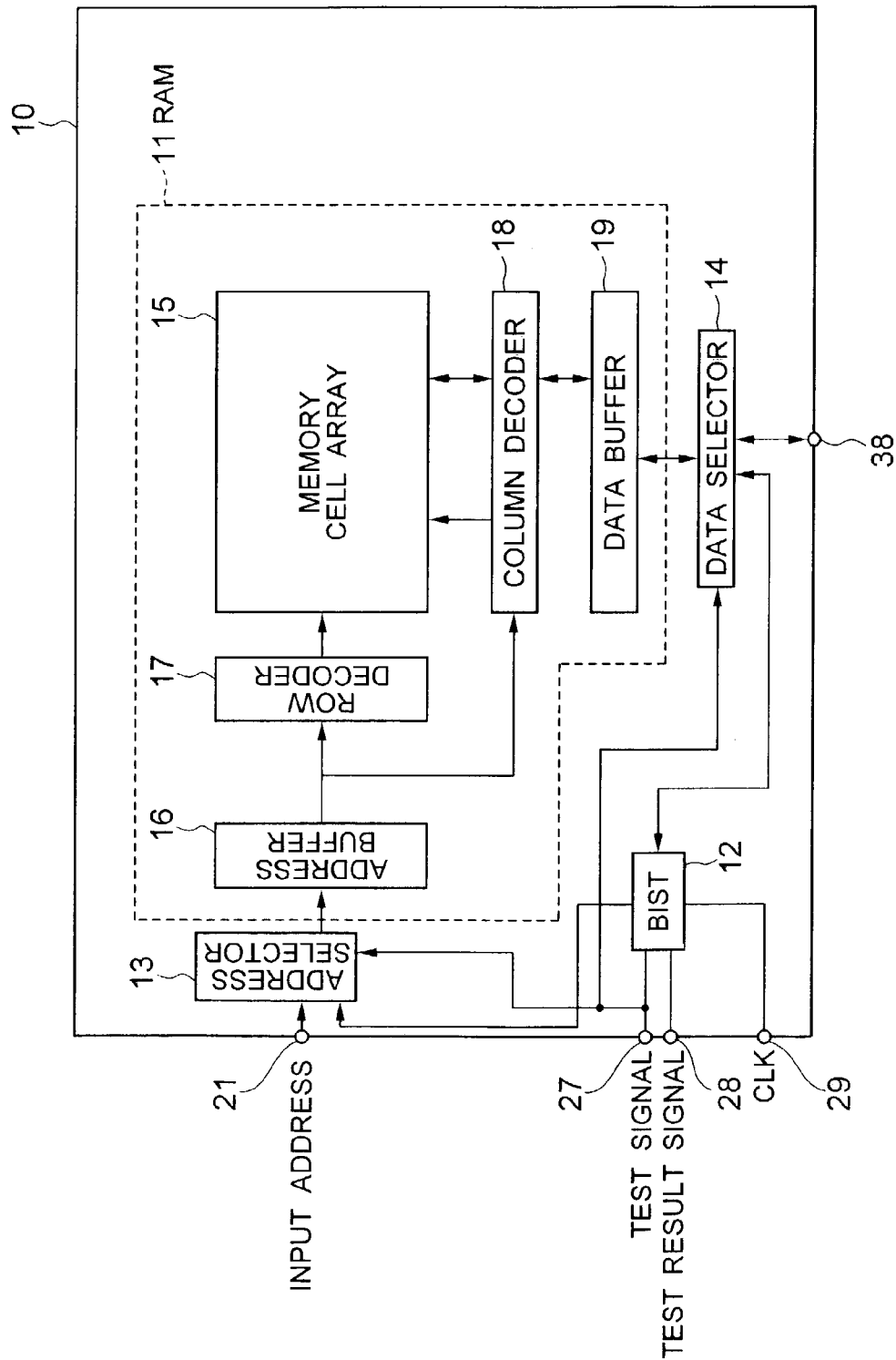
FIG. 1 is a block diagram of an LSI including a BIST circuit according to a first embodiment of the present invention.

The BIST circuit according to the present invention is preferably incorporated in an LSI including a logic circuit and/or memory device, such as system LSI, logic LSI and DRAM.

If the BIST circuit according to the present invention is incorporated in a logic LSI or logic core block, for example, another BIST circuit is preferably incorporated therein including a test pattern generator which generates a scan-in test pattern and a scan-out data expected pattern for conducting a scan path test. The scan path test is generally used for examining the presence or absence of a physical defect in the LSI during a product test. The physical defect may arise due to an incomplete fabrication step such as in a diffusion step or etching step in the fabrication process of the LSI. For detecting the physical defect, the verification test pattern may be used in the product test while assisting the scan path test.

The design verification test pattern is preferably described in a behavior level language for allowing a defect to be found in the early stage of the design of the LSI.

Now, the present invention is more specifically described with reference to accompanying drawings, wherein similar constituent elements are designated by similar reference numerals.

Referring to FIG. 1, an LSI including a BIST circuit according to a first embodiment of the present invention is implemented as a dynamic random access memory (DRAM) device 10. The DRAM device 10 includes a RAM block 11, the BIST circuit 12 for testing the RAM block 11, an address selector 13 for switching the address inputs of the RAM block 15 depending on a normal mode or a test mode, and a data selector 14 for switching the data inputs of the RAM block 15 depending on the normal mode or the test mode. These circuit elements are formed on a single semiconductor chip.

The RAM block 11 includes a memory cell array 15 including a plurality of memory cells arranged in an array, an address buffer 16 for receiving an input address signal to deliver the same to the memory cell array 15, row and column decoders 17 and 18 for decoding the input address signal delivered through the address buffer 16, and a data buffer 19 for transferring data between the memory cell array 15 and an external circuit.

The row decoder 17 decodes the row address of the address signal, whereas the column address decoder 18 decodes the column address of the address signal and transfers data between the data buffer 19 and the column of the memory cell array 15 specified by the column address.

The address selector 13 has address input terminals connected to the normal-mode address pins 21 and address output terminals of the BIST circuit 12, and address output terminals connected to the address buffer 16. The address selector 13 has a control terminal connected to a test-mode signal input pin 27 for receiving a test mode signal from outside the chip, selecting the input address signal received from outside the chip in the normal mode and the address signal delivered from the BIST circuit 12 in the test mode. The data selector 14 has a control terminal connected to the test mode input pin 27, connecting normal-mode data input/output pins 38 to the data buffer 19 in the normal mode whereas connecting data output terminals of the BIST circuit 12 to the data buffer 19 in the test mode.

The BIST circuit 12 has terminals connected to the test-mode signal input pin 27, test result output pins 28, a clock input pin 29, and the input terminals of the address selector 13 and the data selector 14. The BIST circuit 12 is activated by the active level of the test mode signal for selecting the test mode of the DRAM device, generating therein verification test pattern including address patterns, command pattern specifying read or write operation, and write data and expected data for the test mode without an additional input signal.

The BIST circuit 12 compares the read data read from the memory cell array 15 against the expected data generated in the BIST circuit 12 during the test mode, delivering therefrom the comparison results to outside the DRAM device 10 through the test result output pin 28. The BIST circuit 12 is inactivated by the inactive level of the test mode signal for selecting the normal mode, whereby the RAM block 11 performs normal write and read operations between the same and the external circuit through the data input/output pins 25.

Figure 2:
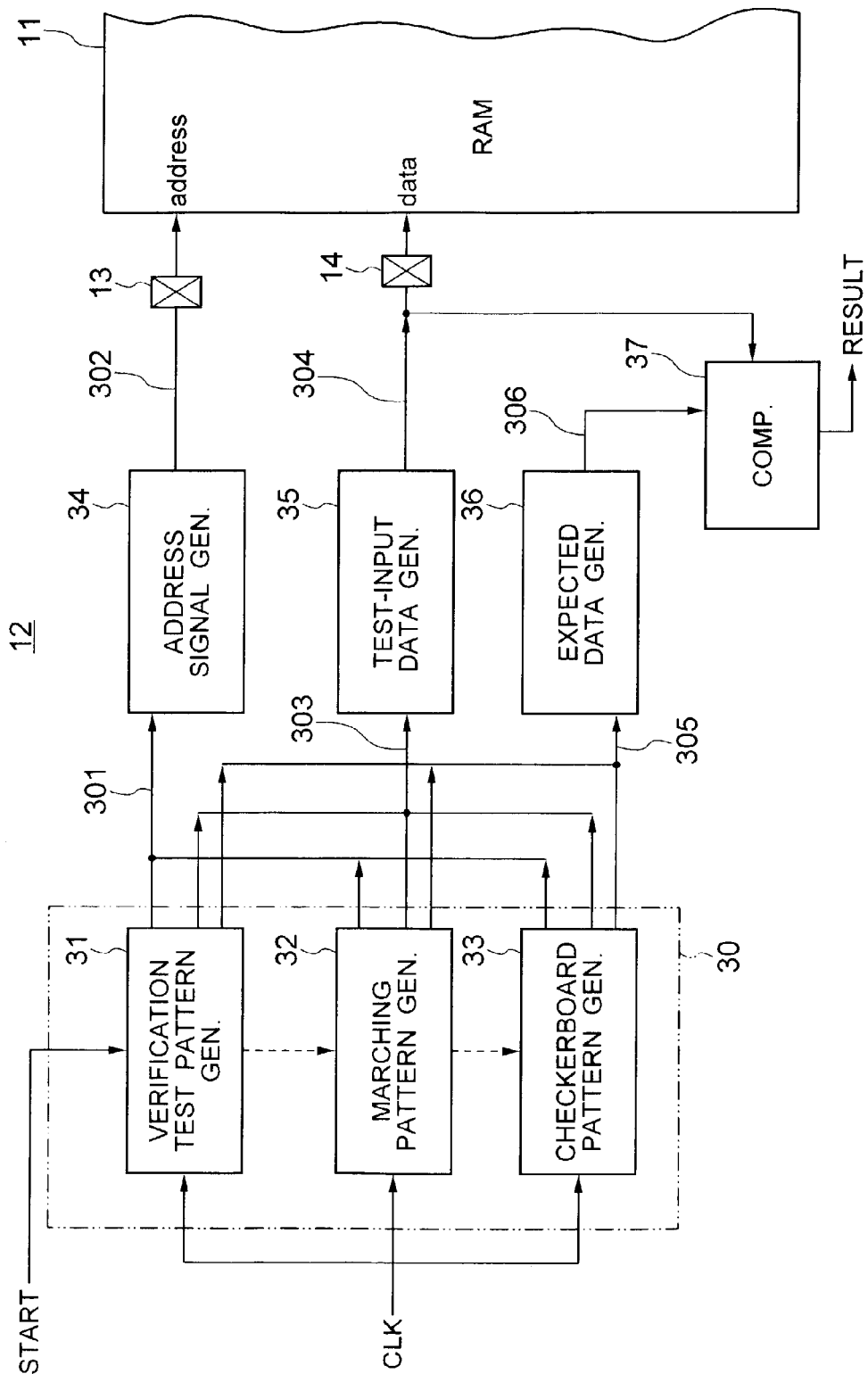
FIG. 2 is a block diagram of the BIST circuit shown in FIG. 1.

Referring to FIG. 2, the BIST circuit 12 includes a test pattern generator block 30 which includes a verification test pattern generator 31, a marching pattern generator 32 and a checkered pattern generator 33, an address signal generator 34, a test-input data generator 35, an expected data generator 36 and a comparator 37.

Each pattern generator 31, 32 or 33 in the test pattern generator block 30 generates a corresponding specified pattern, and delivers an address pattern 301 in the specified pattern to the address signal generator 34 as a serial-data signal. The address signal generator 34 delivers an address signal 302 including row and column addresses to the RAM block 11 through the address selector 13 and the address inputs of the RAM block 11. The write data signal 303 in the specified pattern generated by each pattern generator 31, 32 or 33 is fed to the test-input data generator 35. The test-input data generator 35 generates test write data 304 based on the input write data signal 303, delivering the test write data 304 to the RAM block 11 through the data selector 14 and the data inputs of the RAM block 11.

The test-input data generator 35 is implemented as a timing controller, for example, which controls the timing of the input of data to the RAM block 11 in synchrony with the input of the address signal to the RAM block 11. The read data signal 305 generated by each pattern generator 31, 32 or 33 is delivered to the expected data generator 36, which generates expected data for each memory cell and delivers the same to the comparator 37. The expected data generator 36 is implemented as a timing controller, similarly to the input data generator. The comparator 37 compares the read data 307 read from each memory cell against the expected data 306, delivering the comparison results as a test result signal 308 to outside the DRAM device 10 through the test result output pin 28.

Each of the RAM block 11 and constituent elements 31 to 37 of the BIST circuit 12 is subjected to separate design verification at a circuit level thereof in the design stage of CAD. The verification test pattern generator 31 is provided herein for verifying the correctness of interconnections between the BIST circuit 12 and the RAM block 11. In operation of the product test mode, a "START" signal first assumes an active level to activate the BIST circuit 12 after the test mode signal is activated.

In the pattern generator block 30, the verification test pattern generator 31 first starts for the test of the connections responding to the active level of the START signal. After the test is finished based on the verification test pattern generated by the verification test pattern generator 31, the marching pattern generator 32 and then the checkered pattern generator 33 start for the operational test of the RAM block 11. If the verification is to be conducted based only on the verification test pattern during the design stage of the RAM device, then provision of the clock signal to the BIST circuit 12 is stopped after the completion of the design verification test based on the verification test pattern generated by the pattern generator 31.

Figures 3A, 3B, 3C:
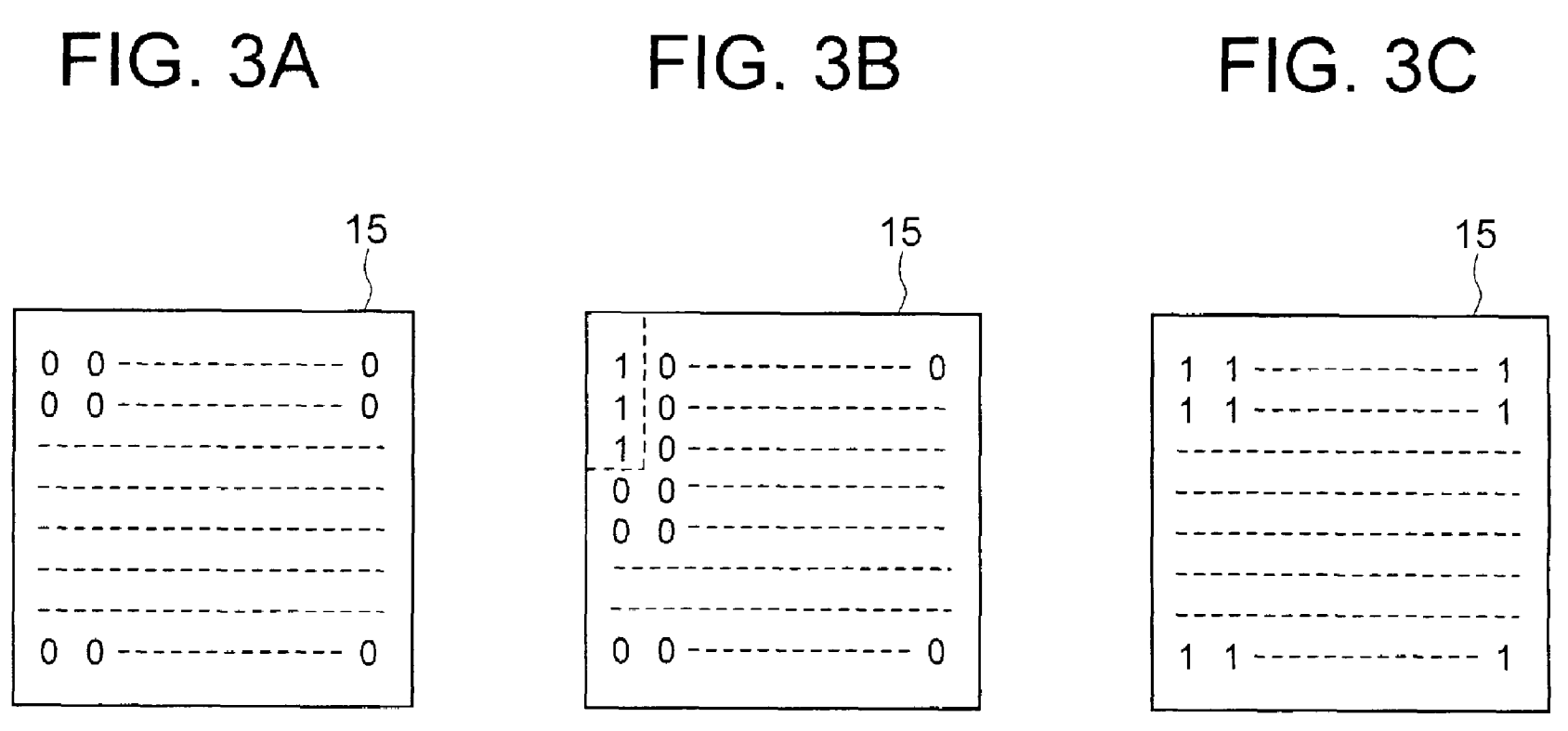

Referring to FIGS. 3A to 3C, there are consecutively shown lists of data stored in the memory cells during the marching pattern test of the product test which is conducted based on the pattern generated by the marching pattern generator 32. First, all the N memory cells of first to N-th addresses (or address zero to address N−1) in the memory cell array are initialized to store therein data "0" by consecutively writing data "0" in the ascending order of the addresses. This situation is shown in FIG. 3A.

Subsequently, data "0" is read from the memory cell of 1st address (referred to as simply "1st address" hereinafter) in the first row and the first column, and then compared against the expected data, followed by writing data "1" into the 1st address, reading the data "1" from the 1st address, and comparing the read data against the expected data, thereby ending the test for the 1st address.

Thereafter, the test is performed for the next, 2nd address (address "1") in the second row and the first column, wherein a similar procedure is conducted for the 2nd address. The test is consecutively performed for the addresses in the subsequent rows in the ascending order of the addresses along the first column. FIG. 3B shows the stored data after the test for the 3rd address is completed, wherein 1st to 3rd addresses store therein data "1" whereas the remaining addresses store therein data "0". After the test is finished for the first column, the test is performed for the next column similarly to the first column in the ascending order of the addresses, and continued up to the N-th address in the last row and the last column, whereby the first stage of the marching pattern test is finished. The data stored in the memory cells at the end of the first stage is shown in FIG. 3C.

Thereafter, the second stage of the marching pattern test is performed beginning with the N-th address toward the first address in the descending order. The test in the second stage of the marching pattern test is performed by reading the stored data "1" from the selected address, comparing the read data against the expected data, then storing data "0" in the selected address, reading the data "0" from the selected address and comparing the read data against the expected data. The data stored in all the memory cells shift from the state shown in FIG. 3C through the state shown in FIG. 3B to the final state shown in FIG. 3A.

The marching pattern test is conducted for detecting a degeneration defect wherein the data in a memory cell is fixed either at "1" or at "0", a coupling defect wherein data is defectively written in a memory cell upon writing the data in an adjacent memory cell, and a defect in the address decoder.

Figure 4A:
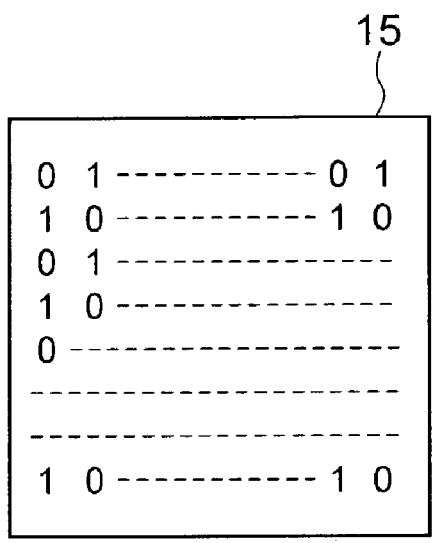
FIGS. 4A and 4B are schematic diagrams of data stored in the memory cells during a checkered pattern test.
Figure 4B:
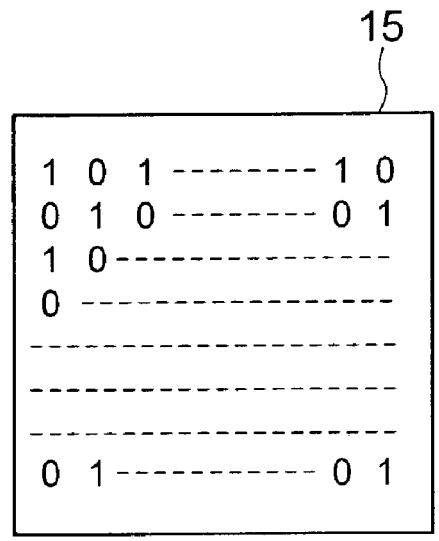

Referring to FIGS. 4A and 4B, there are shown lists of data during the procedure in the checkered pattern test. First, initialization is performed to store data "0" and "1" in all the memory cells so that data "0" and "1" thus stored appear alternately as viewed from the first address to the N-th address. This situation is shown in FIG. 4A. Subsequently, the data "0" and "1" are read consecutively from the first address to the N-th address, and compared against the expected data.

Thereafter, data "1" and "0" are stored in all the memory cells so that data "1" and "0" thus stored appear alternately as viewed from the first address to the N-th address. This situation is shown in FIG. 4B. The stored data are then read consecutively from the first address to the N-th address, and the read data is compared against the expected data. In the checkered pattern test, both the read and write operations are conducted in the ascending order of the addresses. The checkered pattern test is conducted for detecting a degeneration defect and a pattern sensitive defect.

The verification test pattern generator 31 generates a verification test pattern, wherein the data used for writing and reading operations are similar to the data used in the marching pattern test. However, the number of selected addresses in the verification test pattern generator 31 is different from that of the marching pattern test.

More specifically, the addresses selected for writing and reading operations in the design verification test correspond to $2^n$-th addresses wherein n is an integer, while skipping the other addresses. This is because it is sufficient that the design verification pattern test be used for detecting a connection defect of the interconnects in the RAM device. The connection defect can be detected by specifying the row address lines and the column address lines only once for every row address line and every column address line.

Thus, the design verification pattern test is conducted by specifying one of the $2^n$-th addresses, reading data "0" from the specified address, comparing the read data against the expected data, writing data "1" in the specified address, reading the data "1" from the each specified address and comparing the read data against the expected data. After the test for the specified address is finished, another $2^n$-th address is specified in the ascending order and is subjected to similar read and write operations. The $2^n$-th addresses are selected in both the ascending order and the descending order of the addresses.

The procedure for skipping selection of the addresses will be described hereinafter. For selecting the addresses in the ascending order, the second address, i.e., address "1" is first selected as the starting address, then the next address is obtained by multiplying the number "1" of the starting address by two, and the subsequent addresses are obtained by consecutively multiplying the numbers of the addresses previously specified by two until the multiplied number exceeds N−1. That is, the selected address are 1, 2, 4, 8, . . .

For selecting the addresses in the descending order, assuming that the first value for parameter A equals "1", the starting address is specified by the number (i.e., N−1) of the last address minus A. Subsequently, while replacing the previous value for A by the next value for A which is obtained by A=A×2, the next address is obtained by the number (N−1) of the last address minus A. This procedure is iterated until the value for parameter A exceeds the number of the last address. The practical circuit which achieves calculation of these addresses may be implemented by a counter for counting the number of clock pulses in a clock signal and an associated logic circuit for performing calculation based on the count in the counter. In an alternative, the circuit may be implemented by using a shift register.

Figure 5A:
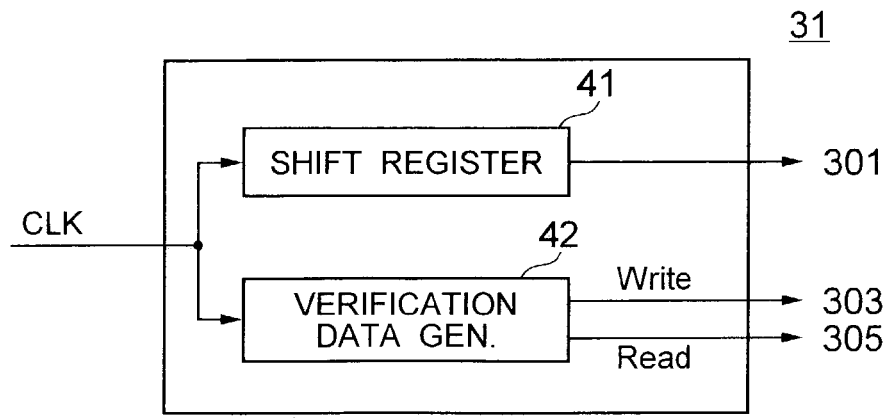
FIGS. 5A to 5C are block diagrams of the verification test pattern generator, marching pattern generator and checkered pattern generator, respectively, shown in FIG. 2.
Figure 5B:
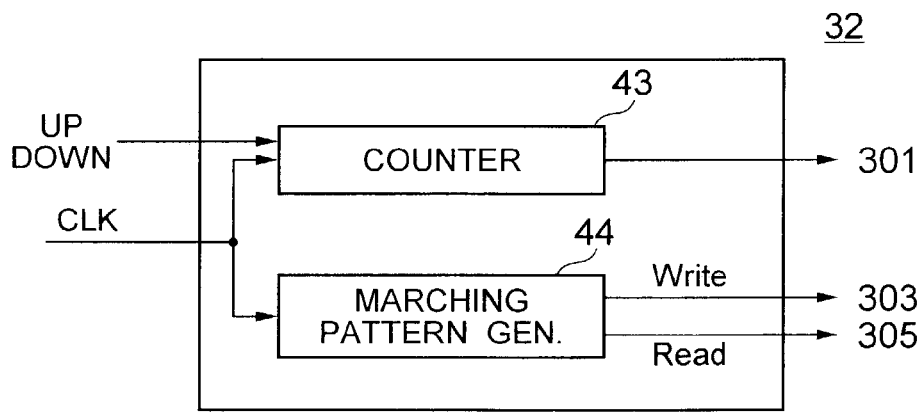
Figure 5C:
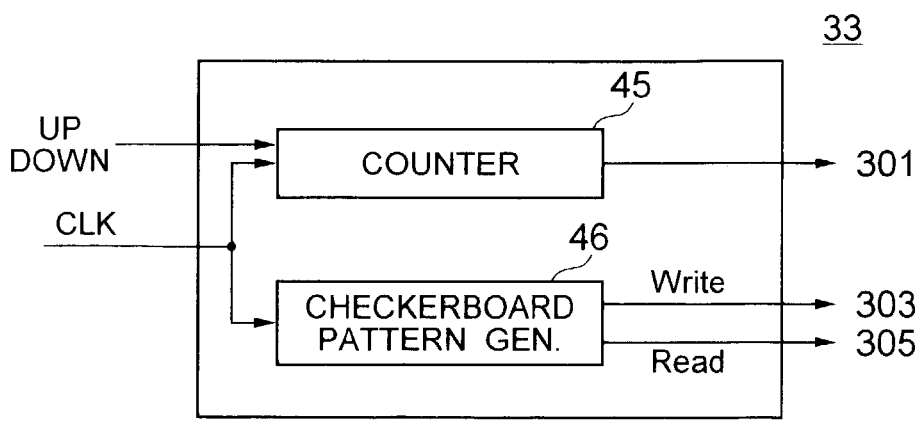

FIGS. 5A to 5C show examples of the pattern generators 31, 32 and 33, respectively. The verification test pattern generator 301 shown in FIG. 5A includes a shift register 41 for generating an address pattern 301 and a verification data generator 42 for generating a write data pattern 303 and an expected data pattern 305. The shift register 41 receives an input test-mode clock signal CLK to thereby generate the address pattern 301, and delivers the address pattern 301 to the address generator 34 shown in FIG. 2.

In the initialization, write data "0" is iteratively output as the write data pattern 303 from the verification data generator 42 each time the outputs 301 of the shift register 41 are changed. After the initialization, verification test pattern generator 31 shifts in a marching test mode, whereby the outputs of the shift register 41 are once reset to "0", as shown at the top figure in FIG. 6A, which shows an example of a 4-bit configuration of the shift register 41. Then, the addresses are specified in the ascending order, wherein the least significant bit of the outputs is first set at "1", and the data "1" is shifted toward the most significant bit at each clock pulse, as shown at the remaining figures in FIG. 6A.

The verification data generator 42 delivers the expected data for each address delivered from the shift register 41 as the expected data pattern 305. The verification data generator 42 delivers "0" for the first expected data, then delivers "1" for the next expected data, and then alternates expected data "0" and "1" each time the shift register 41 changes its outputs 301. For specifying the addresses in the descending order, all the outputs of the shift register 41 are set at "1" for the initialization, then data "0" is set at the most significant bit and shifted toward the least significant bit.

The marching pattern generator 32, as shown in FIG. 5B, includes an up/down counter 43 for counting the test-mode clock pulses to generate an address pattern, and a marching data generator 44 for generating write data and expected data similar to those generated by the verification test pattern generator 31. FIG. 6B shows an example of the shift of the outputs of the up/down counter 43 in the case of a 4-bit address configuration.

The checkered pattern generator 33, as shown in FIG. 5C, includes a counter 45 for counting the test-mode clock pulses, and a checkered data generator 46 for delivering "0" and "1" alternately each time the counter 45 changes its output until the count in the counter 45 exceeds the number (N−1) of the last address. The counter 45 counts up at the count of N−1, and iterates delivering all the addresses twice.

Figure 7:
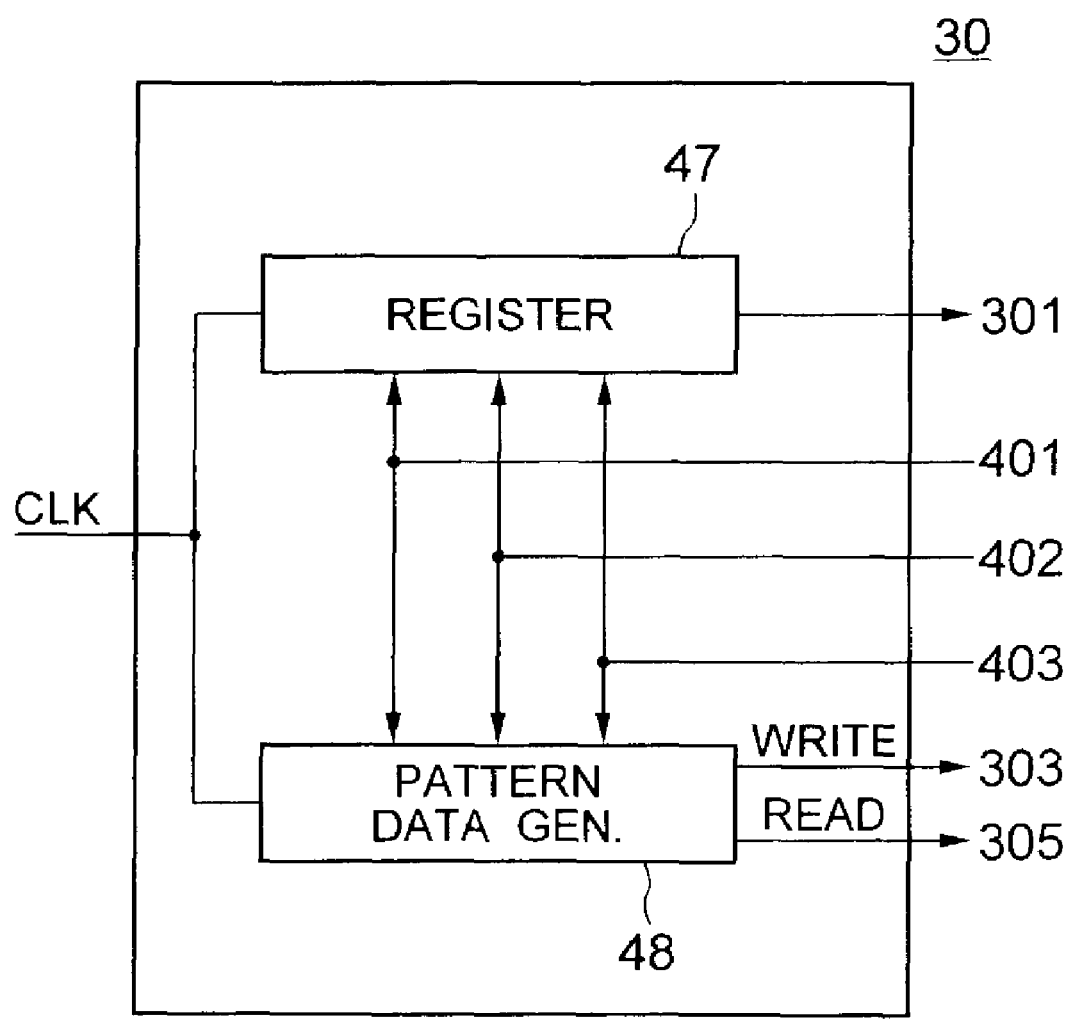
FIG. 7 is a block diagram of another example of the test pattern generator.

Referring to FIG. 7, another example of the test pattern generator block 30 includes a register 47 for storing address patterns for all of the different test modes and a single pattern generator 48. The single pattern generator 48 receives one of a verification pattern mode signal 401, a marching pattern mode signal 402 and a checkered pattern mode signal 403 to operate in a corresponding test mode. The single pattern generator 48 operates with the input test-mode clock signal CLK to generate write data and expected data for each test mode.

Figure 8:
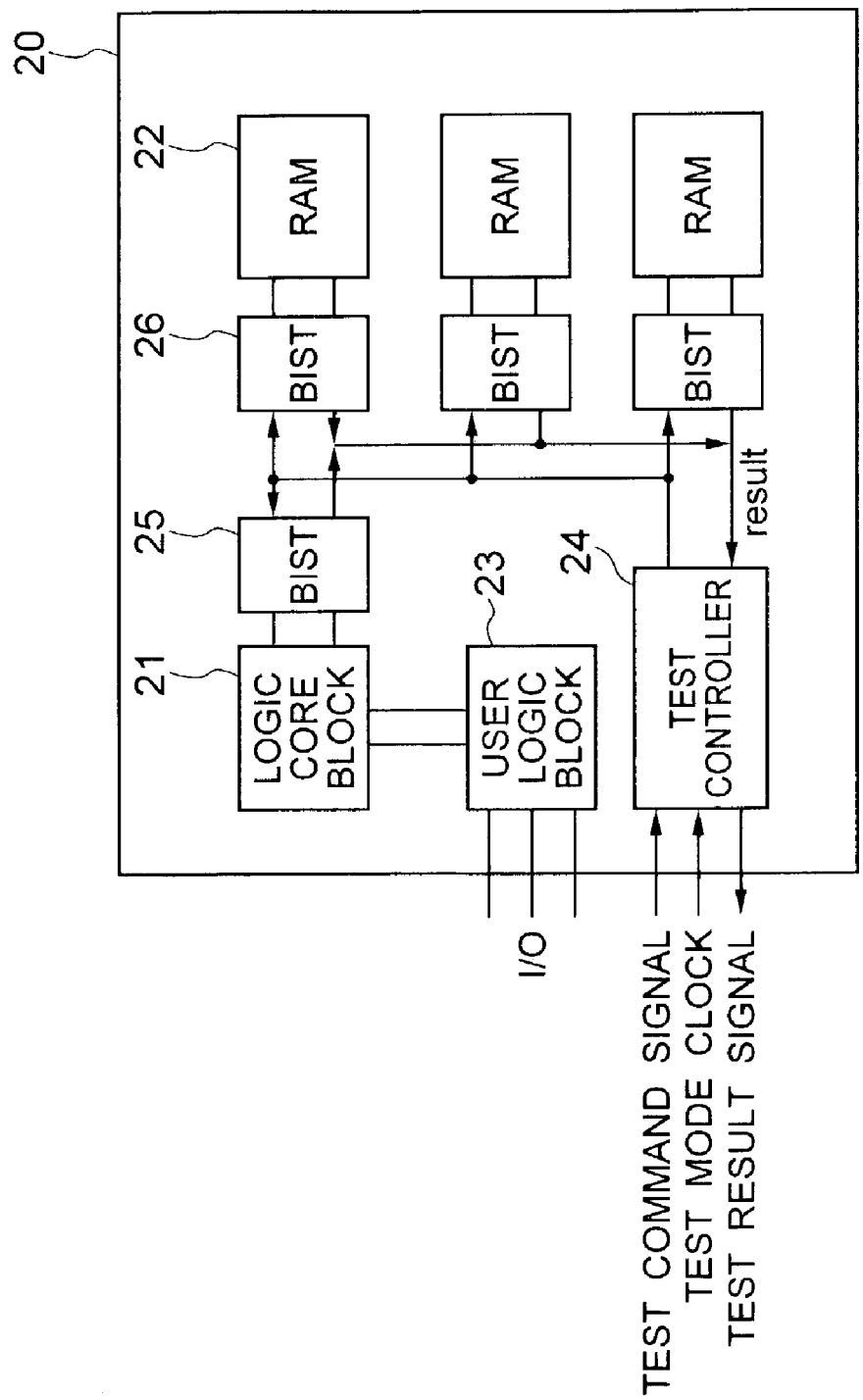
FIG. 8 is a block diagram of a system LSI including BIST circuits according to a second embodiment of the present invention.

Referring to FIG. 8, a system LSI generally designated by numeral 20 includes a logic core block 21, a user logic block 23, a first BIST circuit 25 for testing the logic core block 21, a plurality of RAM blocks 22, a plurality of second BIST circuits 26 each disposed corresponding to one of the RAM blocks 22, and a test controller 24 for controlling the BIST circuits 25 and 26.

The logic core block 21 operates for processing of desired tasks, the user logic block 23 converts the data delivered from the logic core block 21 into a data format which the user interface can recognize, the plurality of RAM blocks 22 temporarily store therein data for the logic core block 21, and the test controller 24 controls the system LSI 20 to operate in a test mode. The BIST circuits 25 and 26 are used for testing the system LSI 20 in the physical configuration during the product test of the LSI 20 as well as in the design verification test during the design stage of the system LSI 20.

The test controller 24 assumes an active level upon input of the test command signal, thereby delivering the test-mode clock signal and a test start signal to the BIST circuits 25 and 26. Each of the BIST circuits 25 and 26 is activated by these signals to operate for testing the system LSI 20. After the BIST circuits 25 and 26 deliver the test result signals to the test controller 24, the test results are output from the test controller 24. Each of the BIST circuits 26 associated with the RAM blocks 22 has a configuration similar to that described in the first embodiment, and thus the detailed description thereof is omitted herein.

Figure 9:
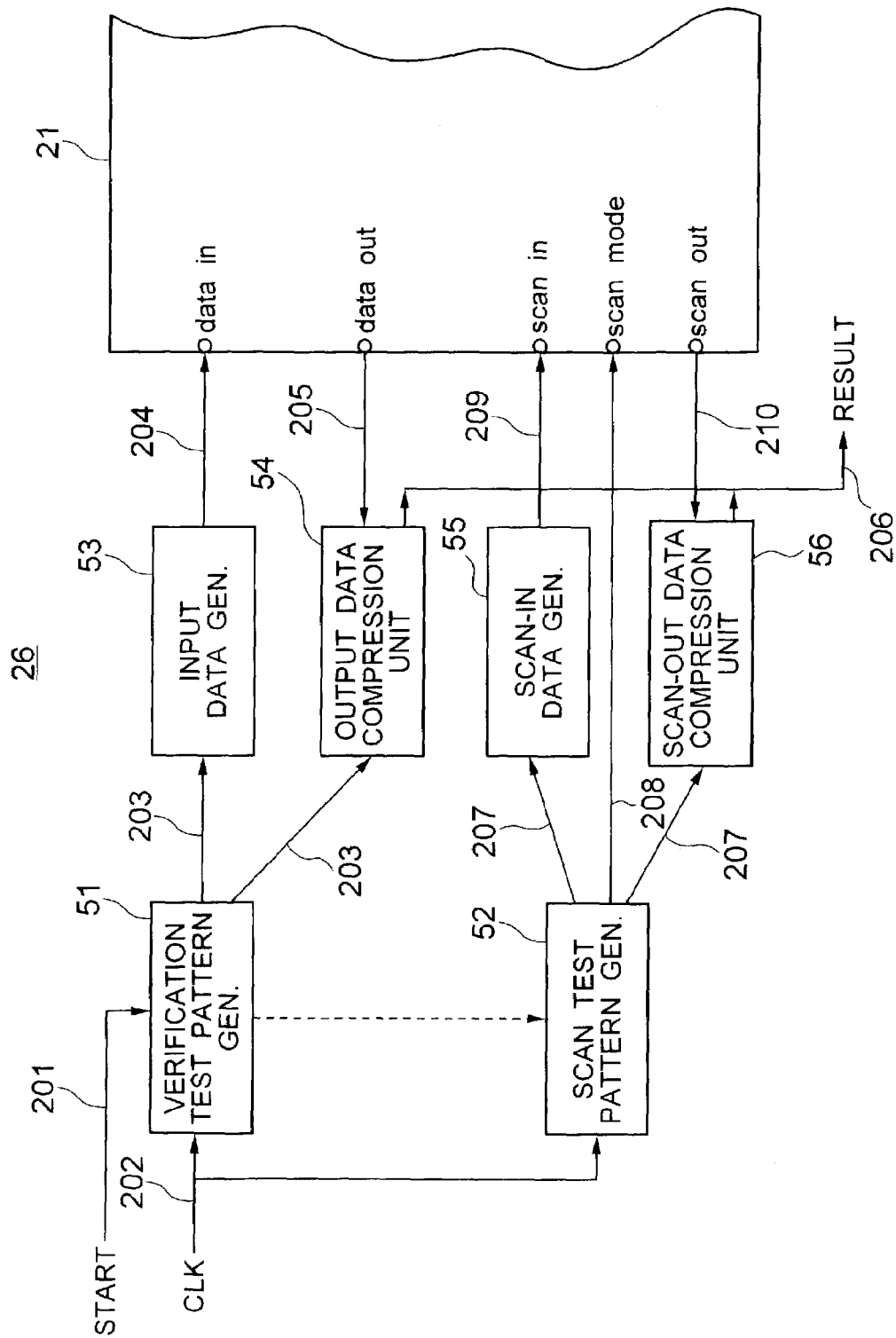
FIG. 9 is a block diagram of one of the BIST circuits shown in FIG. 8.
Figure 10:
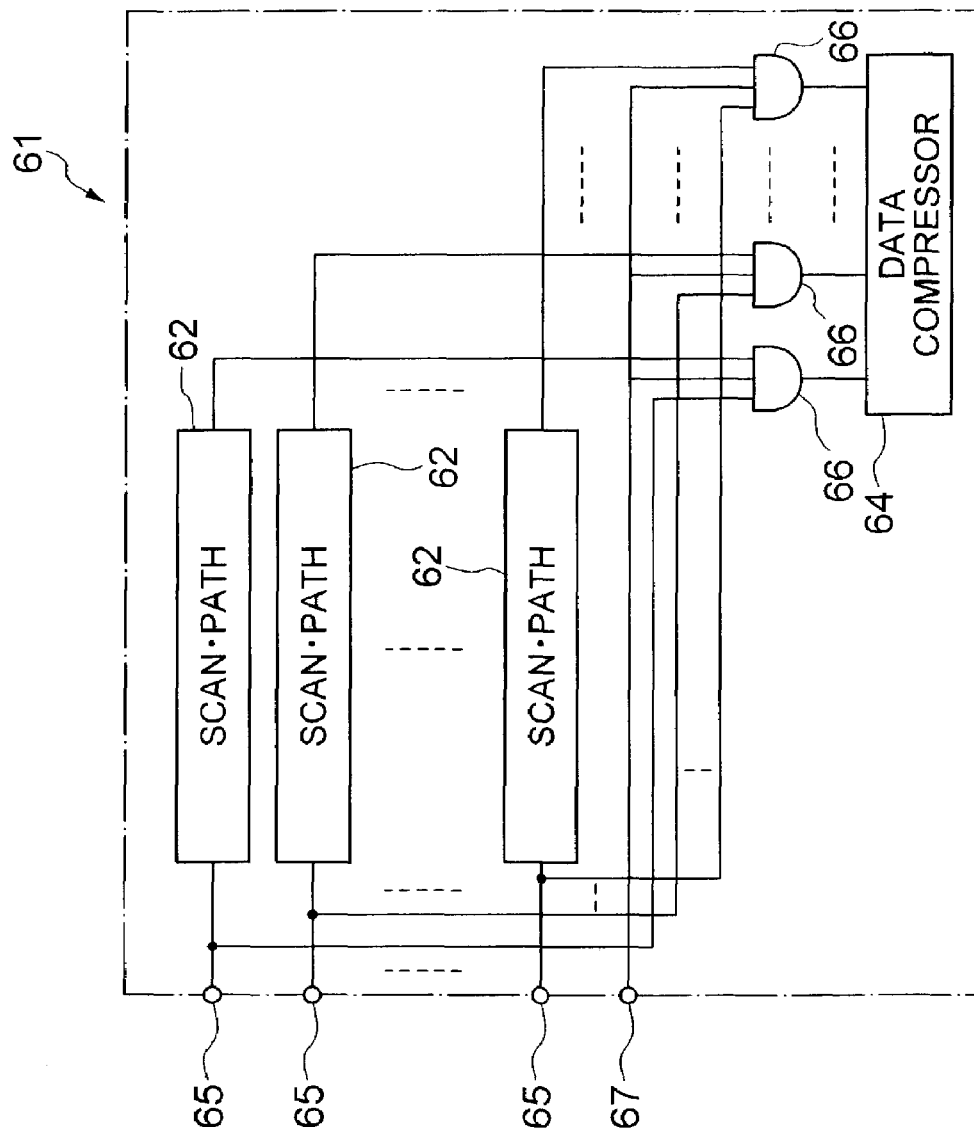
FIG. 10 is a block diagram of an LSI including a conventional BIST circuit.

Referring to FIG. 9, the BIST circuit 25 associated with the logic core block 21 includes a verification test pattern generator 51, a scan test pattern generator 52, an input data generator 53, an output data compression unit 54, a scan-in data generator 55, and a scan-out data compression unit 56, which operate in combination for testing the logic core block 21.

The verification test pattern generator 51 is activated upon receiving the test start signal 201 and the test-mode clock signal 202 from the test controller 24, thereby generating a verification test pattern 203, which may include serial data, to deliver the same to the input data generator 53 and the output data compression unit 54. The input data generator 53 generates an input signal pattern 204, which may include parallel data, based on the verification test pattern 203, to thereby deliver the same to the logic core block 21 at the input pins thereof.

The output data compression unit 54 generates an expected data pattern of the output pins of the logic core block 21 based on the verification test pattern 203 delivered from the verification test pattern generator 51, comparing the outputs 205 from the logic core block 21 against the expected pattern to deliver the comparison results as the test result signal 206 to the test controller 24 after compression thereof.

The scan test pattern generator 52 is activated after a specified time length elapsed from generation of the test start signal 201 and thus the design verification test is completed, thereby generating a scan test pattern 207 for testing the logic core block 21 suing the scan paths. In addition, the scan test pattern generator 52 delivers a scan-mode test signal to the logic core block 21 through the scan-mode pin thereof, thereby allowing the flip-flops in the internal circuit of the logic core block 21 to be connected into a plurality of scan paths.

The scan-in data generator 55 receives the scan test pattern, which may include serial data, from the scan test pattern generator 52, thereby generating a scan test data 209 based on the scan test pattern to deliver the same to the logic core block 21 through the scan-in pins. The scan-out data compression unit 56 generates scan-out expected data based on the scan test pattern 207, comparing the outputs of the logic core block 21 through the scan-out pins against the scan-out expected data to deliver the comparison results as a test result signal 206 to the test controller 24 after compression thereof.

After the product system LSI is fabricated, a product test is conducted by inputting a test command signal. The test command signal triggers a design connection test by using the verification test pattern, wherein connections in the logic core block 21 are examined. After the design connection test is finished, a scan path test is started while using the scan test pattern generated by the scan test pattern generator 52. The results of both the tests are delivered to the test controller 24, which outputs the test results to outside the system LSI.

The BIST circuits 12, 25 and 26 are also used in the design verification test during the design stage of the LSI, as described hereinafter. When the circuit design for determining the circuit connections in the LSI is completed in the design stage of the LSI, the BIST circuits are used for design verification. In this stage of the verification, a simulation is conducted for verification of the circuit connections by a CAD system using the test patterns to be generated by the pattern generators 31 and 51. In the design verification, the design connection test of the logic core block 21 performed using the verification test pattern generated by the pattern generator 51 reduces the time length for the verification test compared to the time length of the scan path test, whereas the test of the DRAM blocks performed using the less number of test patterns reduces the time length of the test compared to the product test for the DRAMs. The design verification of the internal circuit including the BIST circuits during the design stage allows a possible defect to be found in the early stage of the production, preventing later occurrence of redesign of the LSI.

The test bench based on which the verification test pattern is created for verification of the gate-level design may be such as generally used by designers in the register transfer level (RTL) at the initial design stage of the LSI. Such a simulation generally costs a longer time length compared to the actual product test; however, this time length may be reduced by limiting the number of the test patterns to the extent needed to detect only the accuracy of the circuit connections. In the design stage, after the verification test using the verification test pattern generated by the pattern generator 51 is finished, the simulation is ended without conducting the scan path test using the pattern generated by the scan test pattern generator 52.

Although a singe test command signal is used in the above embodiment for both the verification and scan path tests testing the connections and the functions of the LSI, the connection test and the functional test may be started by separate test command signals.

Since the above embodiments are described only for examples, the present invention is not limited to the above embodiments and various modifications or alterations can be easily made therefrom by those skilled in the art without departing from the scope of the present invention.

What is claimed is:

1. A built-in self test (BIST) circuit for testing memory block of an LSI, comprising a verification test pattern generator for generating a verification test pattern, wherein said verification test pattern is dedicated to verification of electric connections in the LSI and includes an address pattern that selects only addresses equal to $2^n$ in said memory block, where n is a positive integer, and wherein said verification test pattern is used for testing connections in said BIST circuit and the memory block as well as connections between said BIST circuit and the memory block.

2. The BIST circuit according to claim 1, wherein said BIST circuit further includes a scan test pattern generator for generating a scan test pattern, said scan test pattern being dedicated to testing the memory block in a scan path test.

3. The BIST circuit according to claim 1, wherein said verification test pattern generator includes a shift register.

4. The BIST circuit according to claim 1, wherein said verification test pattern includes a data pattern which specifies data "1" or "0" as write data, and a command pattern which specifies write or read operation.

5. The BIST circuit according to claim 1, further comprising another test pattern generator for generating another test pattern which specifies all the addresses in said memory block.

6. The BIST circuit according to claim 1, wherein said verification test pattern is described in a behavior level language.

7. A method for testing the LSI in a design stage of the LSI by using the BIST circuit according to claim 6.

8. A method for testing the LSI in a design stage of the LSI by using the BIST circuit according to claim 1.

* * * * *